(12) United States Patent
Tanzawa

(10) Patent No.: US 10,310,734 B2
(45) Date of Patent: Jun. 4, 2019

(54) TIER MODE FOR ACCESS OPERATIONS TO 3D MEMORY

(71) Applicant: Intel Corporation, Santa Clara, CA (US)

(72) Inventor: Toru Tanzawa, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/583,626

(22) Filed: Dec. 27, 2014

(65) Prior Publication Data

US 2016/0188210 A1  Jun. 30, 2016

(51) Int. Cl.
| | |
|---|---|
| G06F 3/06 | (2006.01) |
| G11C 7/00 | (2006.01) |
| G11C 8/12 | (2006.01) |
| G11C 16/08 | (2006.01) |
| G11C 8/08 | (2006.01) |
| G11C 8/14 | (2006.01) |

(52) U.S. Cl.
CPC .......... G06F 3/0604 (2013.01); G06F 3/068 (2013.01); G06F 3/0659 (2013.01); G11C 7/00 (2013.01); G11C 8/12 (2013.01); G11C 16/08 (2013.01); *G11C 8/08* (2013.01); *G11C 8/14* (2013.01)

(58) Field of Classification Search
CPC ........ G06F 3/06; G06F 3/0604; G06F 3/0659; G06F 3/068; G11C 8/12; G11C 16/08; G11C 8/08; G11C 8/14; G11C 7/00
USPC .................................................. 711/154, 100
See application file for complete search history.

(56) References Cited

U.S. PATENT DOCUMENTS

| | | | |
|---|---|---|---|
| 2002/0186588 A1* | 12/2002 | Cho ...................... | G11C 16/08 365/185.09 |
| 2012/0287734 A1 | 11/2012 | Yan et al. | |
| 2013/0170299 A1* | 7/2013 | Yip ..................... | G11C 16/0483 365/185.13 |

(Continued)

FOREIGN PATENT DOCUMENTS

TW    201419287    5/2014

OTHER PUBLICATIONS

International Search Report and Written Opinion for PCT Patent Application No. PCT/US2015, dated Mar. 22, 2016, 11 pages.

(Continued)

*Primary Examiner* — David Yi
*Assistant Examiner* — Zubair Ahmed
(74) *Attorney, Agent, or Firm* — Compass IP Law, PC

(57) ABSTRACT

Tier access mode for three dimensional (3D) memory devices. A 3D memory device has multiple memory elements that are each addressable by a two dimensional address including a wordline address and a bitline address, and a third dimension with a sub-block selector indicating one of multiple portions of a tier of memory elements in the memory device. A memory controller generates a memory access command, such as read or program, to access a first portion of the memory and sends the command to the memory device. The memory device charges a first wordline and a first sub-block in response to receiving the command. For a consecutive access command to access a second portion of the memory, the memory device maintains the first wordline charged without discharging it, and charges a second sub-block selector in response to the consecutive command.

20 Claims, 11 Drawing Sheets

(56) References Cited

U.S. PATENT DOCUMENTS

| | | |
|---|---|---|
| 2013/0258779 A1 | 10/2013 | Liu |
| 2014/0036590 A1 | 2/2014 | Feeley et al. |
| 2014/0122773 A1* | 5/2014 | Abraham ............ G11C 16/0483 711/103 |
| 2014/0204675 A1 | 7/2014 | Cho et al. |
| 2014/0226402 A1* | 8/2014 | Duzly ..................... G11C 16/10 365/185.11 |
| 2014/0241060 A1 | 8/2014 | Ha |
| 2014/0362641 A1 | 12/2014 | Dong et al. |
| 2016/0118110 A1* | 4/2016 | Kim .................... G11C 11/5628 365/185.03 |
| 2016/0148654 A1* | 5/2016 | Sohn .................... G11C 7/1063 365/189.07 |

OTHER PUBLICATIONS

Jaehoon Jang, et al., Vertical Cell Array using TCAT(Terabit Cell Array Transistor) Technology for Ultra High Density NAND Flash Memory, 2009 Symposium on VLSI Technology Digest of Technical Papers, 2 pages.

Jiyoung Kim, et al, Novel Vertical-Stacked-Array-Transistor (VSAT) for ultra-high-density and cost-effective NAND Flash memory devices and SSD (Solid State Drive), 2009 Symposium on VLSI Technology Digest of Technical Papers, 2 pages.

Jungdal Choi, et al., 3D Approaches for Non-volatile Memory, 2011 Symposium on VLSI Technology Digest of Technical Papers, 2 pages.

Ki-Tae Park, et al., Three-Dimensional 128Gb MLC Vertical NAND Flash-Memory with 24-WL Stacked Layers and 50MB/s High-Speed Programming, ISSCC 2014 / Session 19 / Nonvolatile Memory Solutions / 19.5, 2014 IEEE International Solid-State Circuits Conference, 3 pages.

Mark Johnson, et al., 512-Mb PROM With a Three-Dimensional Array of Diode/Antifuse Memory Cells, IEEE Journal of Solid-State Circuits, vol. 38, No. 11, Nov. 2003, 9 pages.

Matthew Crowley, et al., 512Mb PROM with 8 Layers of Antifuse/Diode Cells, ISSCC 2003 / Session 16 / Non-Volatile Memory / Paper 16A, 10 pages.

Ryota Katsumata, et al., Pipe-shaped BiCS Flash Memory with 16 Stacked Layers and Multi-Level-Cell Operation for Ultra High Density Storage Devices, 2009 Symposium on VLSI Technology Digest of Technical Papers, 2 pages.

Wonjoo Kim, et al., Multi-Layered Vertical Gate NAND Flash Overcoming Stacking Limit for Terabit Density Storage, 2009 Symposium on VLSI Technology Digest of Technical Papers, 2 pages.

English Translation of Search Report of R.O.C. Patent Application No. 104139687, 1 page.

* cited by examiner

TIER MODE FOR ACCESS OPERATIONS TO 3D MEMORY

FIELD

Embodiments of the invention are generally related to three dimensional memory devices, and more particularly to a tier mode for accessing a 3D memory.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2014, Intel Corporation, All Rights Reserved.

BACKGROUND

Computing and electronic devices continue to shrink in size, even as higher performance and storage capacity is expected from the devices. Additionally, the more components and the greater the real estate used, the more the devices consume power. Size and power consumption are significant factors in electronic devices, especially handheld and mobile devices. Recent developments in electronic device manufacturing make three-dimensional (3D) circuits possible, which can significantly increase densities. Such circuits with increased densities are of particular interest for memory device applications, because of the opportunities for increased densities and power savings.

However, while 3D memory circuits are supposed to provide power savings, they can experience unexpected power inefficiencies due to their architectures. For example, in 3D memories, the wordline capacitance ($C_{WL}$) increases significantly over comparable 2D structures. The 3D architecture can have wordlines in tiers and sub-blocks, which increases the effective length of the wordline, and therefore its capacitance. The increase in capacitance makes tR (read time) slower, and makes reads costlier in terms of energy per bit compare to 2D memories. In a 2D memory array consecutive read, the memory charges one wordline, reads the wordline, and then discharges the wordline. The memory then repeats the process with the next wordline. In traditional approaches to 3D memory arrays, a similar process of charging the wordline, reading the wordline, and then discharging the wordline is much more costly due to the amount of energy required to charge the wordline.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
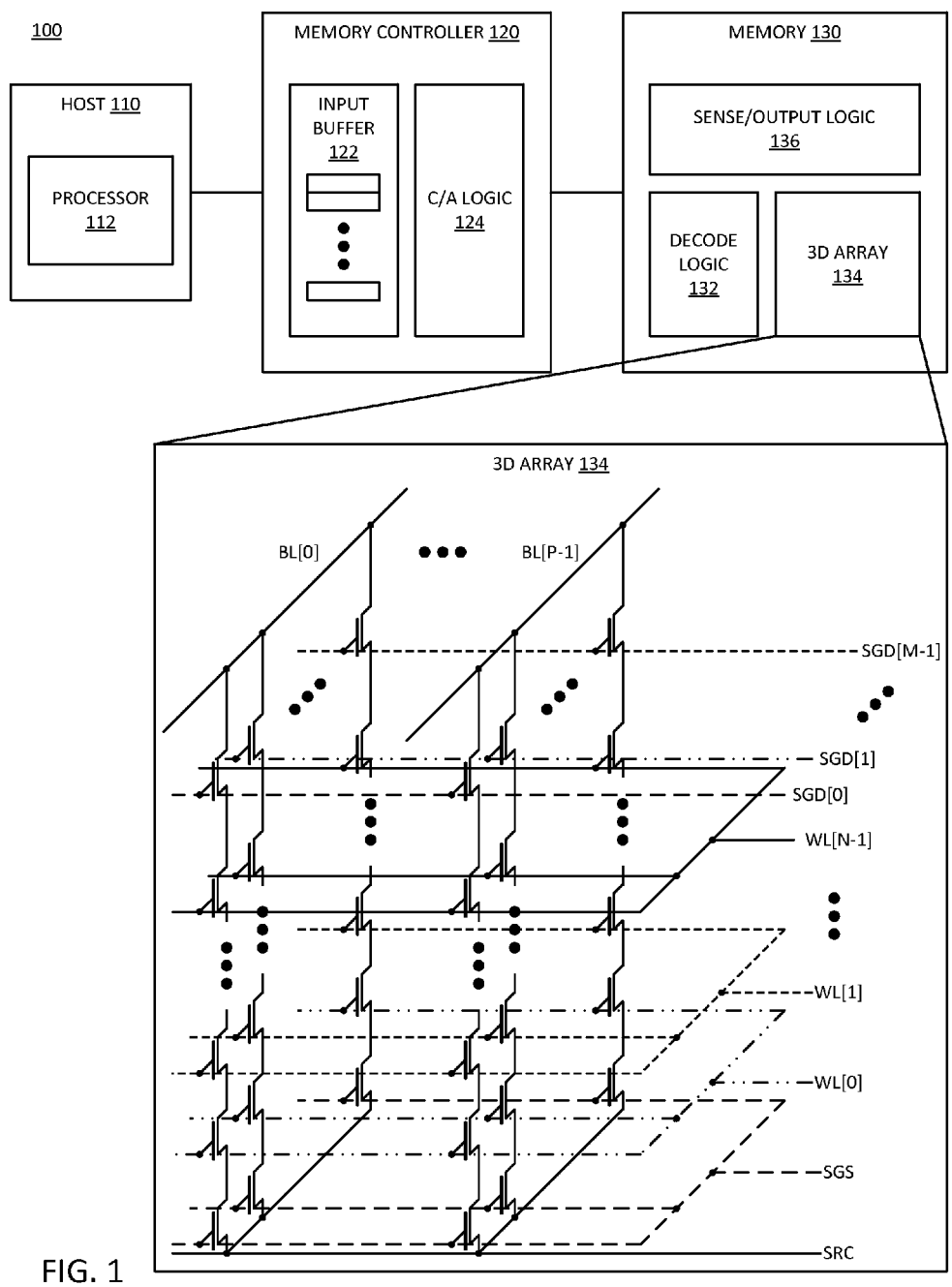
FIG. 1 is a block diagram of an embodiment of a 3D memory that accesses consecutive portions without discharging a wordline between the portions.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, tier modes for three dimensional (3D) memory devices allow the memory to charge a wordline only once with multiple accesses at different sub-blocks of the same wordline. Thus, rather than continually toggling or charging and discharging the wordline, the memory device can charge the wordline once and toggle a sub-block selector to access different portions of data. The memory access command can be a read command to read a portion of memory, a program or write command to write a portion of memory, a verify command to verify a portions of memory, or other access command where a wordline is charged up. Each memory element of the 3D memory is addressable as multiple tiers or planes of two dimensions (2D) of elements. Thus, the memory elements can be addressable with a 2D address including a wordline address and a bitline address, and a third dimension with a sub-block selector indicating one portion of one of the multiple tiers or planes of memory elements in the memory device. The tiers can be tiers of wordlines, where the sub-block selector indicates which portion of the wordline within a tier should be accessed. Thus, a tier mode accesses all portions in a tier for sequential or consecutive access operations prior to moving to the next tier or next wordline. Thus, the tier mode enables the memory device to maintain the wordline charged to an access voltage while each portion in the tier is accessed. The memory device can discharge the wordline when all portions in that tier have been accessed.

A memory controller generates an access command to access a first portion of the memory and sends the command to the memory device. The memory device charges a first wordline and a first sub-block in response to receiving the command. For a consecutive access command to access a second portion of the memory, the memory device maintains the first wordline charged without discharging it, and charges a second sub-block selector in response to the consecutive command, to access a second portion of the same tier. In one embodiment, the memory elements are NAND memory cells. In one embodiment, each portion is a page of memory. In one embodiment, each wordline stores multiple pages (e.g., a binary number of pages, such as 8, 16, 32), each as a separately addressable portion via a sub-block address or a sub-block selector. In one embodiment, the tier access mode is a tier read mode. Tier read mode allows access to each sub-block within a wordline, in contrast to standard page read mode applied to 3D memories that would read the same sub-block address of different wordlines or otherwise discharge the wordline between consecutive read cycles.

Reference to memory devices can apply to different memory types. Memory devices generally refer to volatile memory technologies. Volatile memory is memory whose state (and therefore the data stored on it) is indeterminate if power is interrupted to the device. Dynamic volatile memory requires refreshing the data stored in the device to maintain state. One example of dynamic volatile memory includes DRAM (dynamic random access memory), or some variant such as synchronous DRAM (SDRAM). In one embodiment, the memory is a block-addressable memory device. In one embodiment, the memory is NAND memory. A memory subsystem as described herein may be compatible with a number of memory technologies, such as byte-addressable memory (e.g., a three dimensional crosspoint memory device), or other three dimensional memory architectures with memory elements addressable in three dimensions. The following descriptions refer to the accompanying drawings. It will be understood that the drawings do not necessarily set out elements or components to scale. Certain elements are intentionally drawn out of proportion for purposes of illustration and discussion.

FIG. 1 is a block diagram of an embodiment of a 3D memory that accesses consecutive portions without discharging a wordline between reading the portions. System 100 represents a computing device that includes a 3D memory. Host 110 represents a hardware platform that performs operations to control the functions of system 100. Host 110 includes processor 112, which is a host processor that executes the operations of the host. In one embodiment, processor 112 is a single-core processor. In one embodiment, processor 112 is a multicore processor. Processor 112 can be a general purpose processor that executes a host operating system or a software platform for system 100. In one embodiment, processor 112 is an application specific processor, a graphics processor, a peripheral processor, or other controller or processing unit on host 110. Processor 112 executes multiple agents or software programs (not specifically shown). The agents can be standalone programs and/or threads, processes, software modules, or other code and data to be operated on by processor 112.

During execution of operations by processor 112, an agent executed by the processor can request data and/or code that is not stored in a cache (not shown), and therefore should be obtained from memory 130, which is satisfied with a read operation. An agent executed by the processor can generate a modification to data that is satisfied by a program or write operation. Other access operations can include verification operations to verify a program operation or an erase operation. Thus, host 110 via an agent executed by processor 112 makes a request for data access to memory 130. In one embodiment, memory controller 120 receives and processes data access requests from host 110. Memory controller 120 represents a circuit or logic or processor that manages access to memory 130. In one embodiment, memory controller 120 is part of host 110. In one embodiment, memory controller 120 is part of processor 112. In one embodiment, memory controller 120 is integrated on a common substrate with processor 112. In one embodiment, memory controller is a separate chip from processor 112, and can be integrated in a multichip package (MCP) with processor 112.

In one embodiment, memory controller 120 includes input buffer 122, which represents a queue or logic to store and process incoming requests from host 110. C/A (command/address) logic 124 represents logic within memory controller 120 that generates memory access commands and drives an I/O (input/output) interface between memory controller 120 and memory 130. Memory controller 120 includes I/O circuitry to exchange command, address, and data information over an interconnect or I/O interface with memory 130. Additionally, memory 130 includes I/O circuitry to exchange data with memory controller 120. C/A logic 124 can be or include command generation logic to generate the commands and address information to send to memory 130. In general, C/A logic 124 provides the command and address information to memory 130 via a C/A bus or group of signal lines coupled between the devices to exchange information indicating command and address information. The interface between memory controller 120 and memory 130 can include C/A signal lines and data lines for memory 130 to transfer data back to memory controller 120.

Memory 130 includes decode logic 132 to receive and process memory access commands. Based on the command, decode logic 132 selects different signal lines within 3D memory array 134 to access memory elements within the array. FIG. 1 includes an expanded view of one embodiment of 3D array 134. In the drawing, each transistor represents a memory element. Array 134 is illustrated as having N tiers of wordlines, WL[0:(N−1)], and P bitlines, BL[0:(P−1)]. The bitline and wordline addresses provide two dimensions of address information for the memory elements or memory cells. In addition to these two dimensions, memory elements are addressed by a sub-block address or sub-block indicator, labeled in array 134 as M sub-blocks, SGD[0:(M−1)].

In one embodiment, array 134 is NAND memory block oriented in a 2D plane of wordlines and bitlines, with the sub-blocks providing a third dimension. As illustrated, the bitlines intersect the planes of the tiers of wordlines (where each wordline WL[0:(N−1)] is a tier). Thus, in one embodiment, sub-blocks SGD[0:(M−1)] divide each wordline into separate segments within a tier or within a plane of wordlines. Alternatively, each sub-block can be thought of as intersecting a plane of 2D address locations indicated by a bitline address and a wordline address. Each label, WL[0], WL[1], SGD[0], and so forth, indicates a select signal provided by control logic of decode logic 132. Thus, decode logic 132 includes selection logic to select each of the signal lines illustrated. It will be understood that a signal line in array 134 is a wire or trace or other conductor that provides charge from a driver to the various elements or components. A driver circuit decode logic 132 provides the charge to charge up each signal line to the desired voltage for the desired operation. Each signal line can have an associated voltage level associated with certain operations. For example, each wordline can have a select voltage and a deselect voltage to indicate, respectively, wordlines that are selected for an operation and wordlines that are not selected for an operation.

In one embodiment, array 134 includes other global select signal lines that apply to all elements within a particular dimension, as is understood in the art. For example, array 134 can have a select line signal to charge all bitlines and wordlines to a read voltage in preparation for reading. As another example, array 134 can have a select line signal to charge all bitlines and wordlines to a program voltage in preparation for writing. In array 134, it will be understood that the length of the wordlines can be substantial. In one embodiment, the number of tiers of wordlines is on the order of tens or dozens of wordlines (e.g., N=28, 32, 36, 70, or more). In one embodiment, the number of sub-blocks is on the order of ones or tens (e.g., M=8, 16, or more). Typically, the number of bitlines in array 134 will be on the order of hundreds to thousands (e.g., P=2 K). Thus, in one embodiment, each bitline is relatively short compared to the length of the wordlines. For example, even though each bitline might traverse all wordline tiers and all sub-blocks, each wordline traverses all sub-blocks and bitlines. Thus, it will be understood that the charge-up time for the wordlines and the amount of current needed to charge up the wordlines can be a significant source of power consumption in memory device 130.

C/A logic 124 is configured with information regarding the architecture of memory 130. Thus, C/A logic 124 knows the values of M, N, and P, and understands how the memory elements are arranged in array 134. Thus, C/A logic 124 can generate commands and schedule timing for the commands based on the memory elements desired to be accessed, and the amount of time required to select the memory element (e.g., how long to charge up the lines before applying the bitline voltage to latch the memory values in the sense circuits). C/A logic 124 generates and sends the commands and address information to decode logic 132. Decode logic 132 is or includes selection logic to select or drive the various signal lines (wordline, bitline, sub-block) in accordance with 3D address information provided by C/A logic 124. For consecutive reads, C/A logic 124 can provide consecutive commands with incrementing address information to read one portion and then a next or subsequent portion. For example, C/A logic 124 can generate a sequence of access commands to read/program multiple adjacent portions or pages of memory.

Memory 130 includes an internal controller (not explicitly shown). The internal controller generates internal commands to execute the commands sent by memory controller 120. The internal controller manages decode logic 132 to control the timing and generation of signals from logic 132. Thus, the internal controller can be considered control logic that controls access to the memory elements of array 134 for read, write, and/or verification in response to a command. The internal controller manages sense/output logic 136 to control the timing and generation of signals from logic 136. Thus, the internal controller can be considered control logic that controls the output of data accessed from array 134.

In one embodiment, memory controller 120 accesses memory device 130 with a tier access mode, such as a tier read mode or a tier program mode. In one embodiment, memory controller 120 and/or memory device 130 set a tier access mode via a mode register (not shown) or other configuration register or configuration setting for the memory device. In one embodiment, the tier mode is set by a command that indicates a start and finish address, where memory 130 is to apply the command to all addresses within the range provided by memory controller 120. In tier access mode, memory controller 120 generates commands to access consecutive blocks of data across a single tier of wordlines. Traditionally, memory would charge up a wordline (for example, WL[0]), access a sub-block (for example, SGD[0]), and then discharge the wordline. The memory could then access the next wordline (for example, WL[1]) or the next sub-block (for example, SGD[1]), but would have to recharge the wordline.

In tier access mode, memory 130 charges a wordline (for example, WL[0]), and then consecutively accesses each sub-block (SGD[0:(M−1)]) while maintaining the wordline at the access voltage, without having to recharge the wordline. Significantly, selecting a wordline for access may also require deselecting other wordlines, which means that the discharging on each read cycle would also require recharging the deselected wordlines. Thus, the amount of energy required to charge up the wordlines can be spread across M access operations. More details regarding power use are provided below with respect to FIG. 3. Each sub-block can be selected per access cycle or access command/operation to access different portions of the memory device. In one embodiment, each portion is a whole page of memory where each wordline stores M pages, each selectable via the sub-block selector.

Memory device 130 includes sensing and output logic 136 to transmit read data back to memory controller 120. Memory controller 120 can then provide the data to the agent responsible for the data request that is executing on host 110. Sensing circuitry can include latches or other circuit components to identify the value of a data bit stored at a memory cell. The output circuitry can include drivers and other circuitry to generate an output signal to represent the data stored at the memory elements read. Thus, the portion of data read results in multiple bits of data output logic 136 sends to memory controller 120 in response to a read access command.

Figure 2:
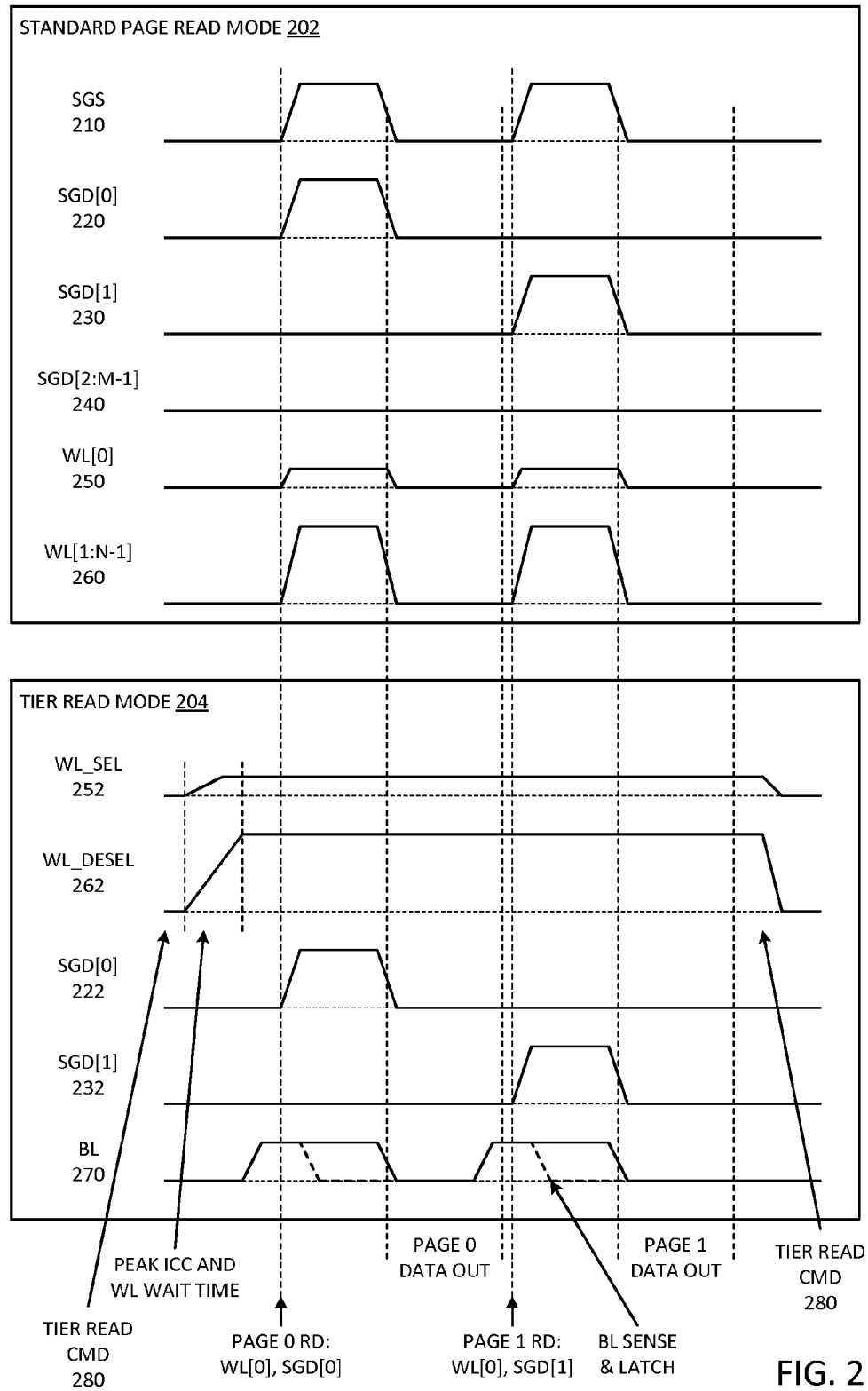
FIG. 2 is a signaling diagram of an embodiment of a tier read mode for a 3D memory.

FIG. 2 is a signaling diagram of an embodiment of a tier read mode for a 3D memory. Standard page read mode 202 represents a standard page read mode sequence applied to a 3D block-based memory device. In one embodiment, a memory subsystem, such as system 100 of FIG. 1, uses a read sequence in accordance with tier read mode 204 for sequential reads. Standard page read mode 202 is illustrated primarily for purposes of comparison with tier read mode 204. The dashed vertical lines represent approximate relative times of the occurrence of various events or operations within a memory subsystem I/O interface (such as the interface between a memory controller and a memory device).

In standard page read mode, signal SGS 210 illustrates the bitline signaling. SGD[0] 220 represents a signaling diagram for a first sub-block, and SGD[1] 230 represents a signaling diagram for a second sub-block. SGD[2:M−1] 240 represents a signaling diagram for non-selected sub-blocks. WL[0] 250 represents a signaling diagram for a first, selected, wordline. WL[1:N−1] 260 represents a signaling diagram for non-selected wordlines. While the size of the various signals generally represents relative voltage-level differences, it will be understood that the signals represented are not necessarily to scale, but are intended to be generally representative. Implementation of a practical system will vary based on technology and specific architectures used. In one embodiment, signals 210, 220, 230, and 240 can swing between roughly 0 V when deselected to approximately 4 V when selected. In one embodiment, signals 250 and 260 can swing between approximately 0 V and 1 V when the wordline is the selected wordline, and between approximately 0 V and 5-6 V when the wordline is a deselected wordline. Again, while not necessarily representative of scale, the signals illustrate a ramp-up and ramp-down time associated with charging up the signal and discharging the signal. The ramp-up and ramp-down times can vary. While not specifically illustrated, it will be understood that higher voltage levels typically have a longer ramping time than lower voltages for a signal line of the same size.

As illustrated in standard page read mode 202, a traditional method of page read applied to a 3D memory involves charging up WL[0] 250 for Page 0 read (or a read of any portion), and then discharging it at the end of the read. Subsequent reading of Page 1 would again involve charging up WL[0] 250 and then discharging it. To read all M portions of the wordline, the wordline would be toggled M times. Similarly, the deselected wordlines would also need to be toggled M times, and at higher voltages.

In one embodiment, tier read mode 204 charges the selected wordline for the entire cycle of reads, for all M portions of the wordline (where M is the number of sub-blocks). Thus, considering two sub-blocks for illustration, SGD[0] and SGD[1], tier read mode 204 illustrates the wordline select and wordline deselect signaling diagrams, WL_SEL 252 and WL_DESEL 262, respectively, the signaling diagrams for the sub-blocks, SGD[0] 222 and SGD[1] 232, and the signaling diagram for the bitline, BL 270. In one embodiment, BL 270 is a representation of SGS 210. It will be understood that WL_SEL 252 represents a signaling diagram for any of the N wordlines that are selected. Similarly, WL_DESEL 262 represents a signaling diagram for the N−1 other wordlines that are not selected. For purposes of illustration at the bottom of the figure, it will be observed that WL[0] is given as the selected wordline, which would mean WL[1:N−1] would be the deselected wordlines.

In one embodiment, a memory controller (such as memory controller 120 of system 100), initiates tier read mode 204 with tier read command (cmd) 280. Such a command can be generated as part of a command signaling, and/or as part of setting a Mode Register or other configuration for the memory device. In one embodiment, the memory controller sends tier read command 280 with a first read command to the memory device. After the first tier read command, the memory controller will wait a period of time to allow the wordline to charge up. It will be understood that the charging up and the timing differences between standard read 202 and tier read mode 204 are not illustrated in FIG. 2. The second command in tier read mode 204 can be issued sooner after the completion of the first read command in tier read mode 204 than a comparable sequence of commands in standard page read mode 202, because in standard page read mode 202 the memory controller will have to wait for the wordline charge-up for each read cycle, where a cycle is the sending and processing of a command for read of a single portion of memory.

Tier read mode 204 explicitly shows a slower ramping on signals 252 and 262, which is the peak ICC or power supply current, while the memory controller waits for the power supply to charge up the wordline. In one embodiment, the memory selection logic charges BL 270, and selects the first sub-block, SGD[0] 222. It will be understood that once the bitline reaches a threshold voltage for the memory element, the charge will transfer to a sensing circuit, which can latch the voltage level of the memory element. The dashed line in BL 270 illustrates the discharging of the bitline voltage through the memory cell to charge up the sensing circuit, even as the solid line in BL 270 illustrates that the selection logic continues to select/charge the bitline. The selection logic discharges the sub-block SG[0] 222 and the bitline BL 270, but does not discharge the wordline, as shown with WL_SEL 252 remaining at a high voltage.

The period illustrated as Page 0 data out represents the memory device output circuitry transmitting the bit values of the portion or page of memory read. In one embodiment, the data out is a sequential read data output of Page 0 at the first address identified in a read command from the memory controller. It will be observed that WL_SEL 252 and WL_DESEL 262 are maintained at their charged-up values. The memory controller generates a subsequent read command for Page 1, which has an address of the same wordline (e.g., WL[0]) with a different sub-block address or selector, SGD[1]. Thus, the bitline BL 270 is again charged and the sub-block charged by selecting SGD[1]. Again, the memory selection logic generates the select signal to charge the appropriate lines and read the data. The sensing circuitry provides sensing and latching operations, and the output circuitry generates a Page 1 data out signal to the memory controller.

In one embodiment, the memory controller generates tier read exit command 290 to cause the memory device to exit from tier read mode. In one embodiment, tier read exit command 290 is a signal to the memory to discharge the wordline voltages. The memory controller generates tier read exit command 290 whenever all portions of the selected wordline have been read. The portions read can be all portions of the wordline. In one embodiment, the portions read are only selected portions of the wordline. In one embodiment, the portions read from the wordline are not adjacent or consecutive (e.g., reading SGD[0] and then SGD[2] without reading SGD[1]). With tier read mode 204, the memory controller can read all portions of the same wordline without having to discharge and recharge (e.g., toggle) the wordline.

Figure 3:
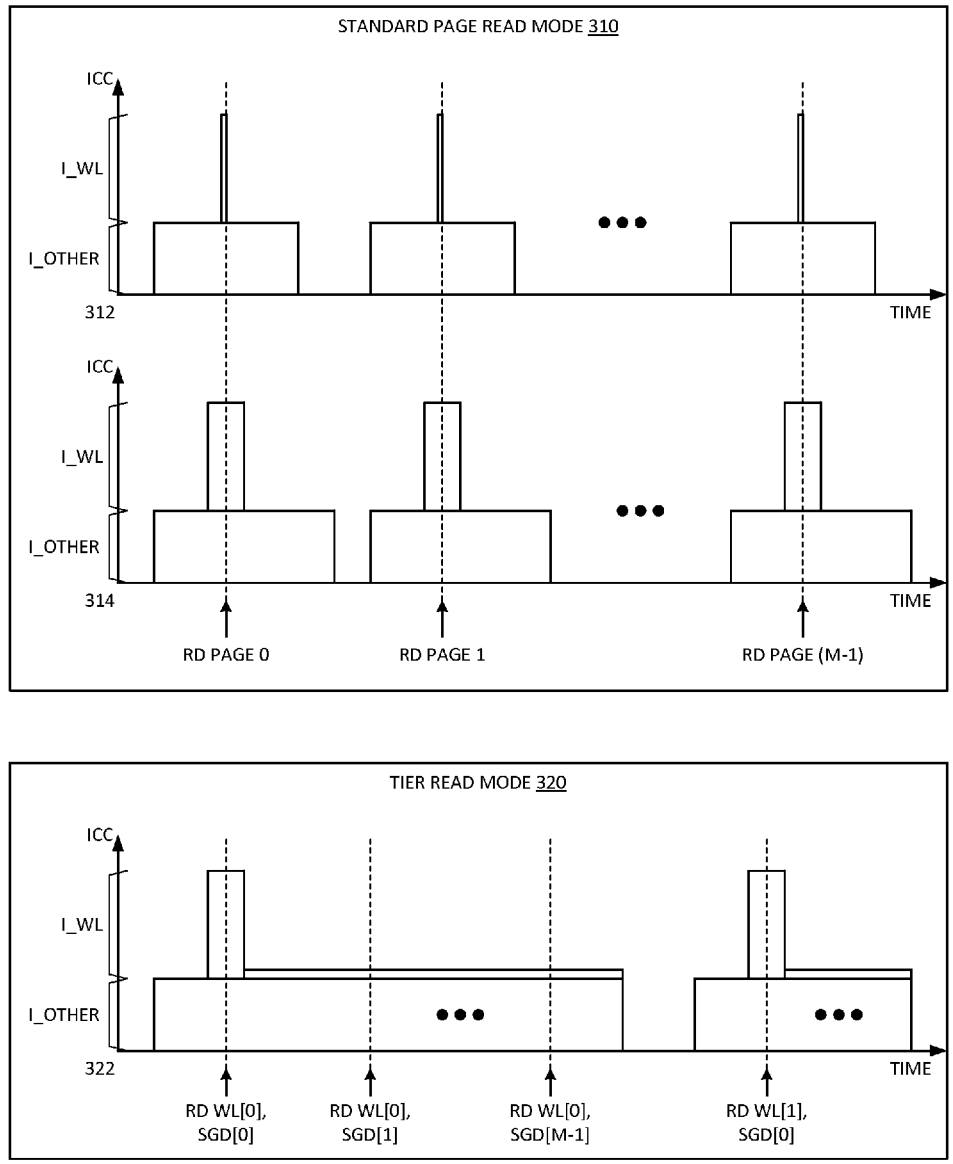
FIG. 3 is a graphical representation of an embodiment of current use over time for a 3D memory.

FIG. 3 is a graphical representation of an embodiment of current use over time for a 3D memory. Standard page read mode 310 represents a traditional page read mode approach to read, where wordlines are discharged after each read cycle. Standard page read mode 310 can be one example of current behavior for a memory device that operates in a standard page read mode sequence such as standard page read mode 202 of FIG. 2. Tier read mode 320 represents current use over time for a tier read mode where the wordline is maintained charged with sub-blocks are toggled for read. Tier read mode 320 can be one example of current behavior in accordance with any embodiment of tier read mode described herein. Similar to FIG. 2, standard page read mode 310 is primarily illustrated to contrast with tier read mode 320. It will be understood that while tier read mode 320 specifically refers to the power characteristics of a memory device in a tier read mode, a similar power characteristic can exist for any type of memory access operation where the wordline voltage is maintained between operations instead of discharged and recharged for each cycle. Thus, the example of a tier read mode is not to be understood as limiting.

Diagram 312 represents the power supply current, ICC, versus time for a 2D block-read memory. Diagram 314 represents ICC versus time for a 3D block-read memory. In both diagrams 312 and 314, the memory selects and discharges the wordline for each portion of data read. In one embodiment, the wordline select voltage is 1.0 V for read, and 5-6 V to deselect. The charging up of the wordlines consumes a significant amount of power and time in 3D circuits.

In diagram 312, the current for all the selection circuitry and input circuitry associated with a read operation are grouped as I_other, and can represent approximately a 20 mA current draw for approximately 40 µs (microseconds) in known memory architectures. It will be observed that there is a brief spike of current usage during each read cycle, which represents the current draw to charge the wordline. In the 2D case of diagram 312, the current draw is approximately 50 mA, and lasts for approximately 1 µs. In diagram 314, there is a comparable current draw for the "other" circuitry as shown by I_other, which may last longer in the 3D case of diagram 314. The charge up and discharge time for the larger wordline in the 3D memory takes time due to the larger capacitance, which could extend the read cycle or read operation out to approximately 50 µs instead of the 40 µs of the 2D case, due to approximately 10 µs to charge the wordline. Thus, diagram 314 illustrates ~50 mA draw for 10 µs associated with charging the wordline for each read operation.

Assume a case where the 2D memory of diagram 312 and the 3D memory of diagram 314 read M consecutive pages of memory. The conventional read time, tR_conv, can be expressed as follows: tR_conv=tPUP+tWL+tBL+tWLrst+ tPDN, where tPUP is the power up time for the "other" circuitry, tWL is the ramping time for the wordline, tBL is the ramping time for the bitline, tWLrst is the time to reset or discharge the wordline, and tPDN is the power down time for the memory input, output, and selection circuitry. The tR for the 2D case can be approximately 10 µs+10 µs+5 µs+10 µs+5 µs~40 µs, while the tR for the 3D case can be approximately 10 µs+20 µs+5 µs+10 µs+5 µs~50 µs. In the 2D case, the average supply current, ICC_ave can be calculated to be approximately 20 mA, which provides a cost of approximately 8 pJ/bit for a 32 KB page size. For the 3D case, ICC_ave can be calculated to be approximately 30 mA, which provides a cost of approximately 14 pJ/bit for the same page size, which indicates that conventional 3D read performance is worse in both time and energy per bit compared to conventional 2D memory reads.

For tier read mode 320, diagram 322 illustrates a similar average current draw for the other circuitry, and a similar spike to charge the wordline as seen in diagram 314. However, due to only needing to charge the wordline once for the M reads, where each read accesses a different sub-block of the same wordline, the energy cost of the current spike can be spread over time. The read time for a 3D case where the memory maintains the wordline charged for a sequence of read operations or read cycles can be expressed as an effective tR, as follows: tR_prop_16sub-blocks=tPUP+tWL+tBL0+tSGD1+tBL1+tSGD2+ tBL2 . . . +tSGD15+tBL15+tWLrst+tPDN, where tPUP, tPDN, and tWLrst can be the same as set out above. The value of tWL can be the same as for the 3D case above, and the value of tBL[0:15] can each be the equivalent of tBL as set out above. The value of tSGD[1:15] can each be approximately 2.5 µs. Notice the significant improvement in time. The initial read in the sequence requires the tWL, but then subsequent consecutive reads can each be much shorter than the ramp-up time to charge the wordline. Thus, in one embodiment, tR_prop_16sub-blocks=10 µs+20 µs+5 µs+15×(2.5 µs+5 µs)+10 µs+5 µs~163 µs. The 163 µs is for reading 16 sub-blocks. When averaging the total tR time over all 16 reads, the tR_ave~10 µs per sub-block (163/16~10). Additionally, the average energy per bit can be significantly improved, with an ICC_ave of 24 mA, and 35 pJ/bit/16 sub-blocks, or 2 pJ/bit.

In standard page read mode 310, each new read is the same as the previous, and so a single sequence is illustrated. For purposes of comparison, tier read mode 320 also illustrates the transition from reading one wordline to reading another. It will be observed that after reading the sub-blocks at wordline WL[0], the memory controller can send a read command for portions of data at WL[1]. Since the wordline is different, the memory discharges WL[0], and charges WL[1]. The charging of WL[1] will have a similar characteristics as described for WL[0], and the energy to charge WL[1] can similarly be spread over multiple portions of WL[1] with sequential reads.

Figure 4A:
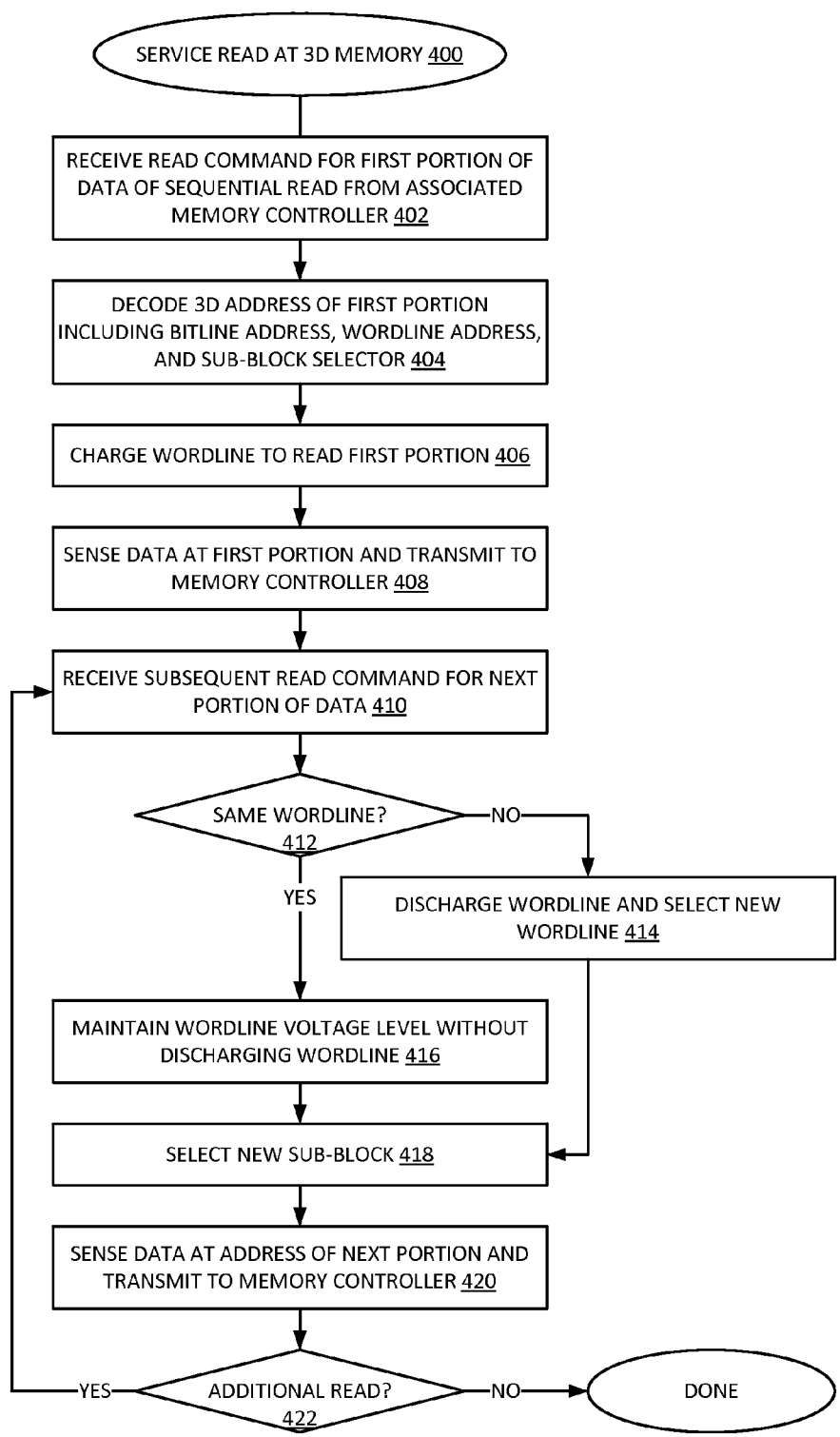
FIG. 4A is a flow diagram of an embodiment of a process for servicing a read command at a 3D memory.

FIG. 4A is a flow diagram of an embodiment of a process for servicing a read command at a 3D memory. Process 400 for servicing a read command at a 3D memory can be implemented by a memory device in accordance with any embodiment described herein. For example, memory 130 of system 100 can perform operations in accordance with process 400. While process 400 specifically addresses tier read mode, the example in process 400 is not limiting. It will be understood that a similar process can be applied for write or program operations, as well as verify operations. In each case the wordline voltage can be maintained across multiple portions of data access operations without being discharged. Thus, the example of process 400 with reference to a tier read mode is merely an example, and is not limiting. Those of skill in the art would understand how to apply process 400 to program and verify access operations.

The memory receives a read command for a first portion of data of a sequential read from an associated memory controller, 402. It will be understood that there can be many separate memory devices in a memory subsystem. The memory resource can be organized as channels, ranks, banks, modules, and/or other organizations. Certain implementations have little to no hierarchy of the memory resources, while modern computing devices typically separate memory along multiple channels with multiple ranks and multiple memory devices in each channel. A memory subsystem can have multiple different memory controllers, and each memory device is associated with a memory controlled that manages access to the associated memory. Read commands can be sent in parallel to multiple devices or other hierarchical separations, and each memory resource will service or execute the read command to return data to the memory controller.

Thus, the memory decodes the 3D address of the first portion of read data, where the 3D address includes a bitline address, a wordline address, and a sub-block address or selector, 404. In one embodiment, the memory selection circuitry charges a selected wordline to read the first portion, 406. The selection circuitry may also need to charge the deselected wordlines to a deselected wordline voltage. Once charged, the selection circuitry can cause the read of the memory elements at the first portion of data, and sense the data. The memory output circuitry transmits the sensed data (or buffers the data for transmission) to the memory controller, 408.

In one embodiment, the memory receives a subsequent read command for a next portion of data, 410. If the subsequent read command is not for the same wordline, 412 NO branch, the memory can discharge the wordline or wordlines, and select a new wordline for read, 414. It will be understood that selecting a new wordline will include charging the new wordline to the proper read voltage, and waiting for any appropriate wait time. In one embodiment, the memory controller provides explicit commands to cause the memory to discharge the wordline, and select a new wordline. If the subsequent read command is for the same wordline, 412 YES branch, the memory can maintain the wordline voltage level or levels without discharging the wordline, 416. Thus, the memory will not experience the energy cost associated with discharging for each new read command.

After selecting the new wordline, 414, or maintaining the same wordline, 416, the memory selects an appropriate sub-block address for the command, 418. The memory senses the data at the address of that next portion, and transmits the data to the memory controller, 420. If there are no additional reads to be made, 422 NO branch, the read servicing ends. If there is an additional read to be made, 422 YES branch, the memory receives the subsequent read command and 3D address, and services or executes the read for the next portion, 410.

Figure 4B:
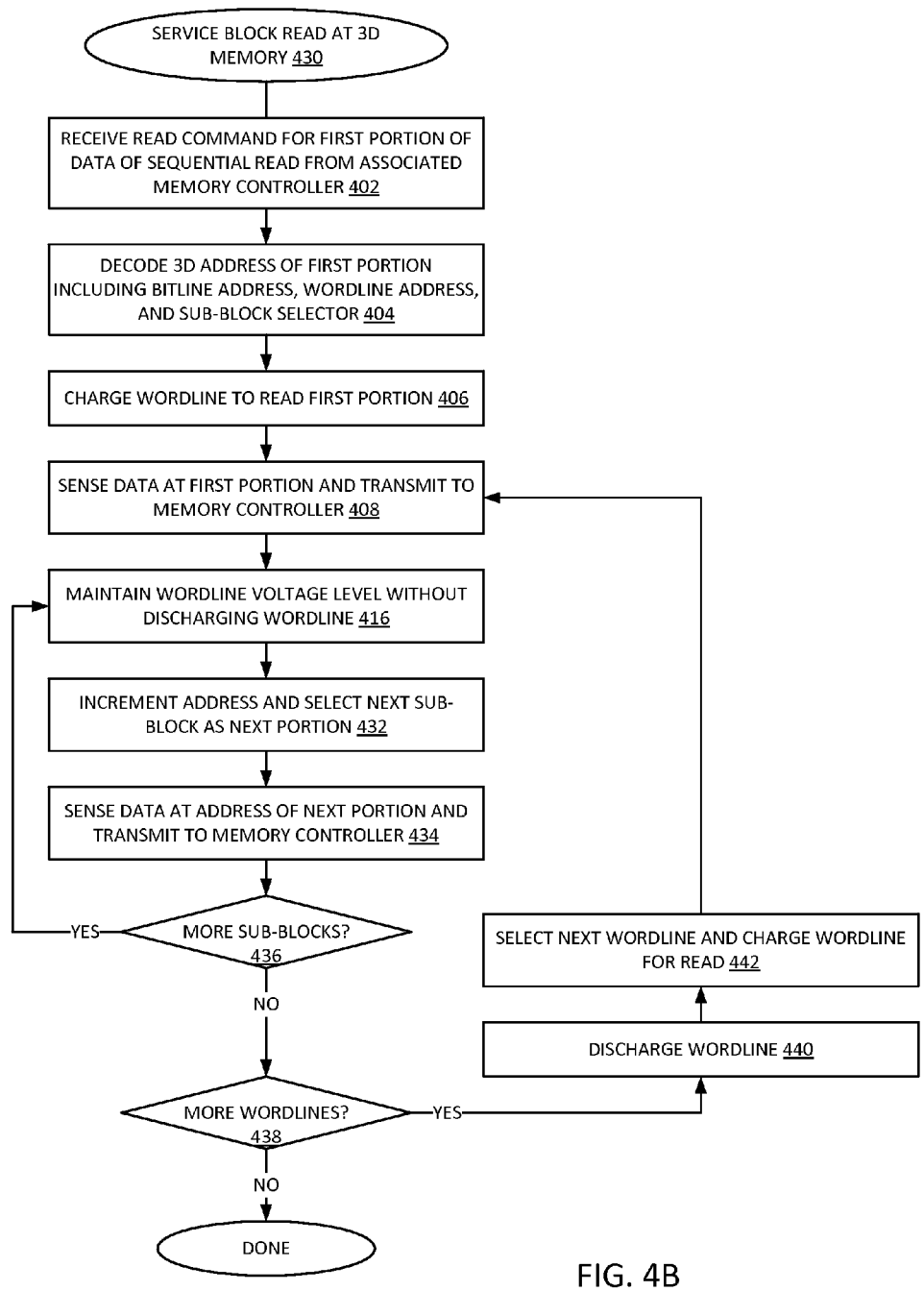
FIG. 4B is a flow diagram of an embodiment of a process for servicing a block read command at a 3D memory.

FIG. 4B is a flow diagram of an embodiment of a process for servicing a block read command at a 3D memory. Process 430 for servicing a block read command at a 3D memory can be implemented by a memory device in accordance with any embodiment described herein. For example, memory 130 of system 100 can perform operations in accordance with process 430. Process 430 may be an alternative to process 400. As with process 400, process 300 specifically addresses tier read mode, but the example in process 430 is not limiting. It will be understood that a similar process can be applied for write or program operations, as well as verify operations. In each case the wordline voltage can be maintained across multiple portions of data access operations without being discharged. Thus, the example of process 430 with reference to a tier read mode is merely an example, and is not limiting. Those of skill in the art would understand how to apply process 430 to block program and verify access operations.

The memory receives a read command for a first portion of data of a sequential read from an associated memory controller, 402. The read command is a block read command, which can trigger the memory to perform multiple consecutive memory access operations. For example, the command can identify a range of addresses or a start and finish address. The command can indicate a first address and a number of portions to access. Thus, the memory decodes the 3D address of the first portion of read data, where the 3D address includes a bitline address, a wordline address, and a sub-block address or selector, 404. In one embodiment, the memory selection circuitry charges a selected wordline to read the first portion, 406. The selection circuitry may also need to charge the deselected wordlines to a deselected wordline voltage. Once charged, the selection circuitry can cause the read of the memory elements at the first portion of data, and sense the data. The memory output circuitry transmits the sensed data or caches the sensed data for transmission to the memory controller, 408.

It will be understood that a controller internal to the memory (e.g., an on-die controller) manages the operation of the memory device, such a controlling the select and other control signals, and managing the timing of signaling to perform the data access operations. In one embodiment, in response to a block read command or other command that requests the memory to perform access operations on a range of memory locations, the internal controller can control the access operations. Thus, in one embodiment, after reading or accessing the data at the first portion, the memory can maintain the wordline voltage level or levels without discharging the wordline, 416. Thus, the memory will not experience the energy cost associated with discharging for each new read command.

In one embodiment, the internal controller increments an address of the 3D address. For example, the internal controller can increment a sub-block address to select the next sub-block as the next portion for the memory access operation, 432. After selecting the next portion, the memory senses the data at the address of that next portion, and transmits the data to the memory controller or caches or buffers it for transmission to the memory controller, 434. In one embodiment, if there are additional sub-blocks in the wordline to read, 436 YES branch, the memory (via the internal controller) maintains the wordline voltage level without discharging the wordline, 416, and increments the address to select the next portion to read, 432. If there are no additional sub-blocks, 436 NO branch, in one embodiment, the memory determines if there are additional wordlines in the range of addresses to access. If there are no additional wordlines to access, 438 NO branch, the read servicing ends. If there is another wordline to access, 438 YES branch, the memory discharges the wordline, 440, and increments a wordline address for the next portion. The memory can then select the next wordline and sub-block as the next portion and charge the wordline for a read operation, 442. The memory then senses the data at the next portion and continue servicing the read command, 408.

Figure 5A:
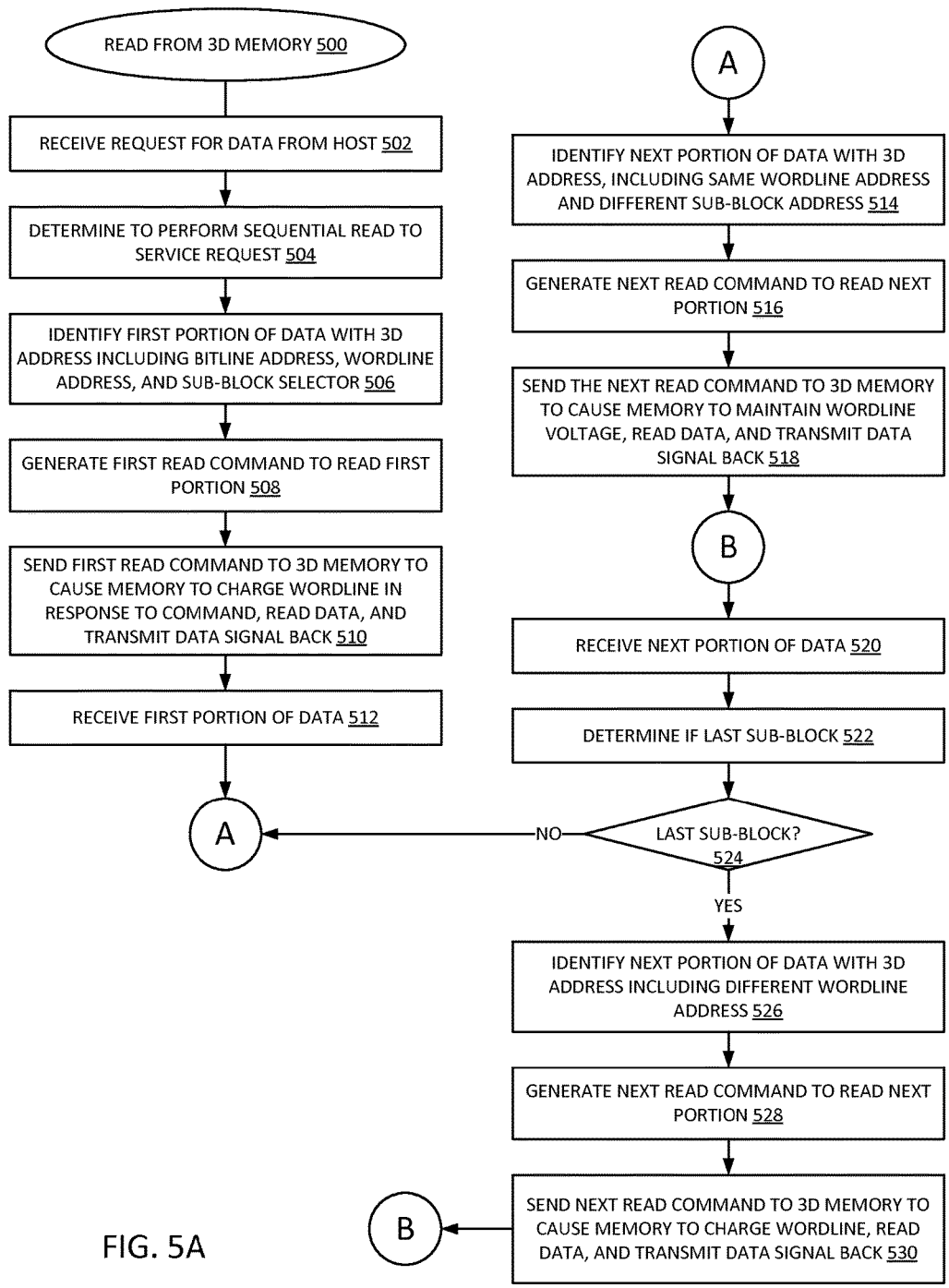
FIG. 5A is a flow diagram of an embodiment of a process for reading from a 3D memory.

FIG. 5A is a flow diagram of an embodiment of a process for reading from a 3D memory. Process 500 for reading from a 3D memory can be implemented by a memory controller in accordance with any embodiment described herein. For example, memory controller 120 of system 100 can perform operations in accordance with process 500. While process 500 specifically addresses read access from a memory controller to a memory, the example in process 500 is not limiting. It will be understood that a similar process can be applied for write or program operations, as well as verify operations. In each case the wordline voltage can be maintained across multiple portions of data access operations without being discharged. Thus, the example of process 500 with reference to a block read is merely an example, and is not limiting. Those of skill in the art would understand how to apply process 500 to program and verify access operations.

The memory controller receives a request for data from the host, 502. The request can be from any agent or process executing on the host that has access to the 3D memory. In one embodiment, the memory controller determines to perform a sequential read to service or execute the request, 504. A sequential read or a consecutive read reads multiple portions of data in sequence, performing multiple read operations or read cycles consecutively. The addresses of subsequent or next portions of data to read may be, but are not necessarily, sequential in addressing in one of the three dimensions.

The memory controller identifies the first portion of data to read with a 3D address including a bitline address, a wordline address, and a sub-block address or selector, 506. The memory controller generates a first read command to read the first portion, 508. The memory controller sends the first read command to the 3D memory to cause the memory to charge the selected wordline in response to the command, read the data at the selected address, and transmit the data back to the memory controller, 510. In one embodiment, the memory charges the selected wordline to a read voltage level and the non-selected wordlines to a deselected voltage level.

In one embodiment, the memory controller receives the first portion of data from the memory, 512.

In one embodiment, the memory controller identifies a next portion of data to read, including a 3D address for the next portion. For at least one sequential read, the memory controller identifies a next portion that has the same wordline address as the previous portion, but has a different sub-block address, 514. The memory controller generates the next read command to read the next portion, 516, and sends the next command to the memory. In response to receiving the subsequent read command, the memory maintains the same wordline voltage levels and reads the data at the other sub-block, and transmits the read data back to the memory controller, 518. In one embodiment, the memory controller receives the next portion of data from the memory, 520. In one embodiment, the data can be queued at the memory and transmitted in a burst. Thus, in one embodiment, the memory controller generates a series of read commands, and the memory executes the series of commands and queues the data from all commands. The memory can then transmit data in multiple transmit cycles, instead of sending data one portion per transmit transaction.

In one embodiment, the memory controller determines if the last sub-block of the wordline has been read, 522. If the last portion of the wordline has not been read, 524 NO branch, the memory controller can identify the next sub-block for the same wordline to issue a read command, 514. If the last portion of the wordline has been read, 524 YES branch, in one embodiment, the memory controller can identify a next portion of data that has a different wordline address, 526. In one embodiment, the memory controller can generate a next read command for the next portion at a different wordline address, 528, and send it to the memory. In response to such a next read command, the 3D memory can charge the wordline, read the data, and transmit the data to the memory controller, 530. The memory controller can then receive the data, 520, and continue with additional portions of data, if any.

Figure 5B:
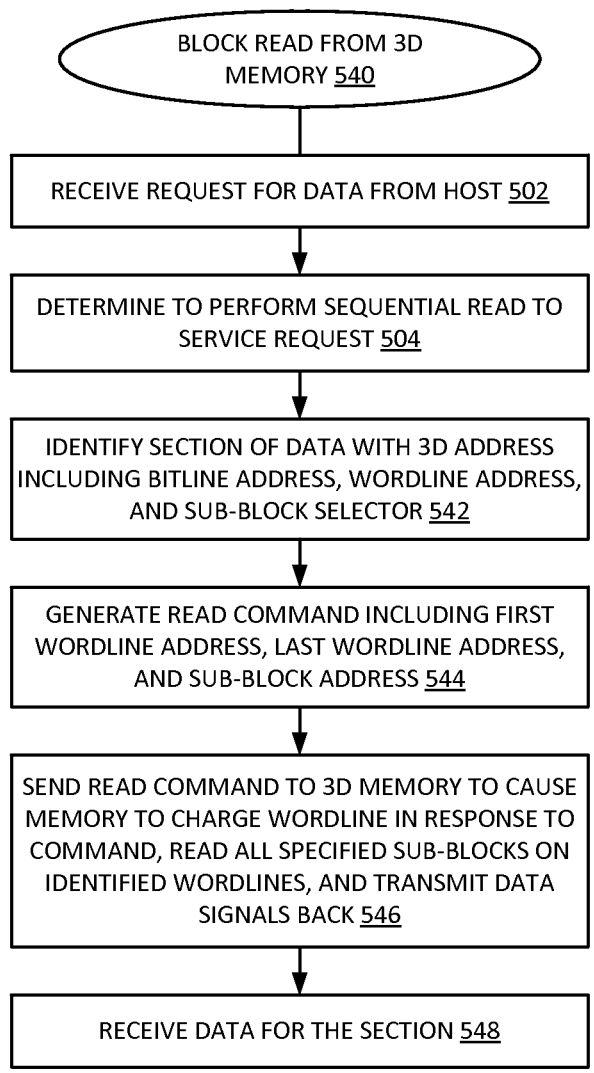
FIG. 5B is a flow diagram of an embodiment of a process for block reading from a 3D memory.

FIG. 5B is a flow diagram of an embodiment of a process for block reading from a 3D memory. Process 500 for reading from a 3D memory can be implemented by a memory controller in accordance with any embodiment described herein. For example, memory controller 120 of system 100 can perform operations in accordance with process 500. While process 500 specifically addresses read access from a memory controller to a memory, the example in process 500 is not limiting. It will be understood that a similar process can be applied for write or program operations, as well as verify operations. In each case the wordline voltage can be maintained across multiple portions of data access operations without being discharged. Thus, the example of process 500 with reference to a block read is merely an example, and is not limiting. Those of skill in the art would understand how to apply process 500 to program and verify access operations.

The memory controller receives a request for data from the host, 502. The request can be from any agent or process executing on the host that has access to the 3D memory. In one embodiment, the memory controller determines to perform a sequential read to service or execute the request, 504. In one embodiment, the memory controller identifies a section of data that includes multiple portions of data to read. The memory controller can identify the section with a 3D address including a bitline address, a wordline address, and a sub-block address or selector for a first portion of data, 542. In one embodiment, the memory controller generates a read command to read the first portion and includes a first wordline address and a last wordline address or range of addresses, 544.

The memory controller sends the command to the 3D memory to cause the memory to charge the selected wordline in response to the command, read all sub-blocks for the identified wordlines, and transmit the data back to the memory controller, 510. In one embodiment, the memory charges the selected wordline to a read voltage level and the non-selected wordlines to a deselected voltage level, and via an internal controller, performs multiple read operations in series without discharging the wordline. When the internal read operation requires changing wordlines, the memory can discharge the wordline and select a new wordline, and then maintain the voltage levels of that wordline for all sub-blocks to be read from that wordline. The memory controller receives the data for the section from the memory, 548.

Figure 6:
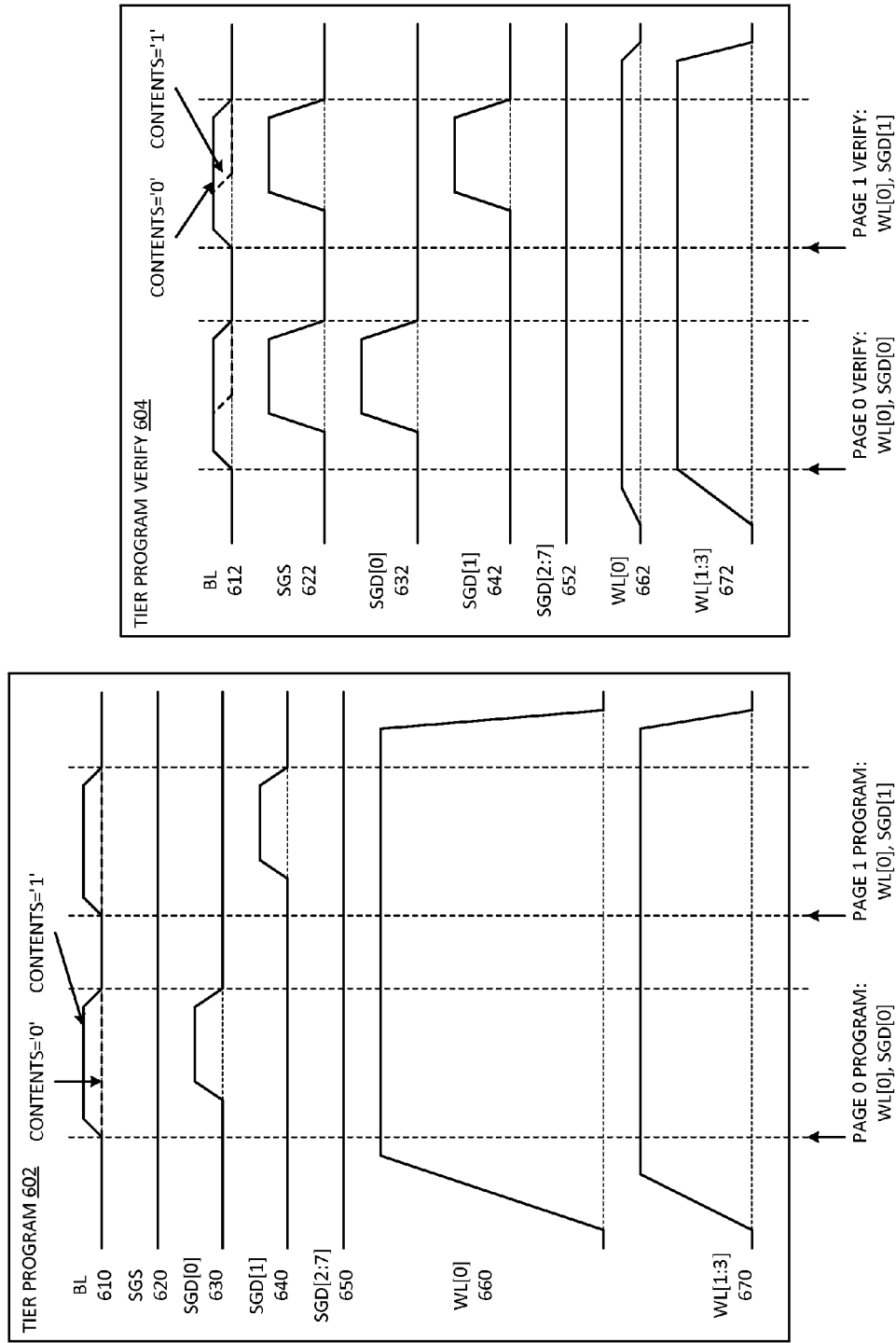
FIG. 6 is a signaling diagram of an embodiment of a tier program mode and tier program verify for a 3D memory.

FIG. 6 is a signaling diagram of an embodiment of a tier program mode and tier program verify for a 3D memory. In one embodiment, a memory subsystem, such as system 100 of FIG. 1, uses a program sequence in accordance with tier program mode 602 for sequential writes and tier program verify 604 for verifying the sequential writes. In one embodiment, tier program 602 charges the selected wordline for the entire cycle of writes, for all portions of the wordline to program. In one embodiment, the example of tier program 602 assumes 8 sub-blocks (SGD[0:7]) and 4 wordlines (WL[0:3]). Considering two sub-blocks for illustration, SGD[0] and SGD[1], tier program 602 illustrates the signaling for selected wordline WL[0] 660 and deselected wordlines WL[1:3] 670. SGD[0] 630, SGD[1] 640, and SGD[2:7] 650 illustrate signaling for the sub-block select lines. BL 610 illustrates the signaling diagram for the bitline, and SGS 620 illustrates the signaling diagram for a select gate.

While the signaling diagrams are not necessarily to scale, in one embodiment, signals 630, 640, and 650 can swing between roughly 0 V when deselected to approximately 2 V when selected. In one embodiment, signals 660 and 670 can swing between approximately 0 V and 20 V when selected to program memory elements in the wordline, and between approximately 0 V and 10 V when deselected. In BL 610, when a bit is to be programmed to a logic 1, the voltage can be set high, and when programmed to a logic 0, the voltage can be set low. It will be understood that different bits in the page can be set individually to 1 or 0 based on the specific bitline. In one embodiment, Page 0 programming includes selecting WL[0] and SGD[0]. The system programs Page 1 by maintaining WL[0] at the same voltage level, and selecting SGD[1]. Such a cycle can continue for as many sub-blocks of WL[0] are selected.

In tier program verify 604, the memory can verify the programming made in tier program 602. BL 612 illustrates the signal of read bits, where the higher line represents the bitline signal if the contents of the memory cell are '0', and the dashed line represents the bitline signal if the contents of the memory cell are '1'. In one embodiment, signal SGS 622 is selected for each sub-block as it is selected for read to verify the data written. In one embodiment, signals 622, 632, 642, and 652 can toggle between approximately 0 V and 4 V when deselected and selected, respectively. Signals SGD[0] 632, SGD[1] 642, and SGD[2:7] 652 can select the desired sub-block for verifying the write. For tier program verify 604, in one embodiment, selected wordline WL[0] 662 can be charged or ramped to approximately 1 V and be maintained (e.g., by an internal controller of the memory) for all sub-blocks to be verified in the wordline. For tier program verify 604, in one embodiment, deselected wordlines WL[1:3] 672 can be charged or ramped to approximately 6 V and be maintained (e.g., by the internal controller of the memory) for all sub-blocks to be verified in the wordline.

Figure 7:
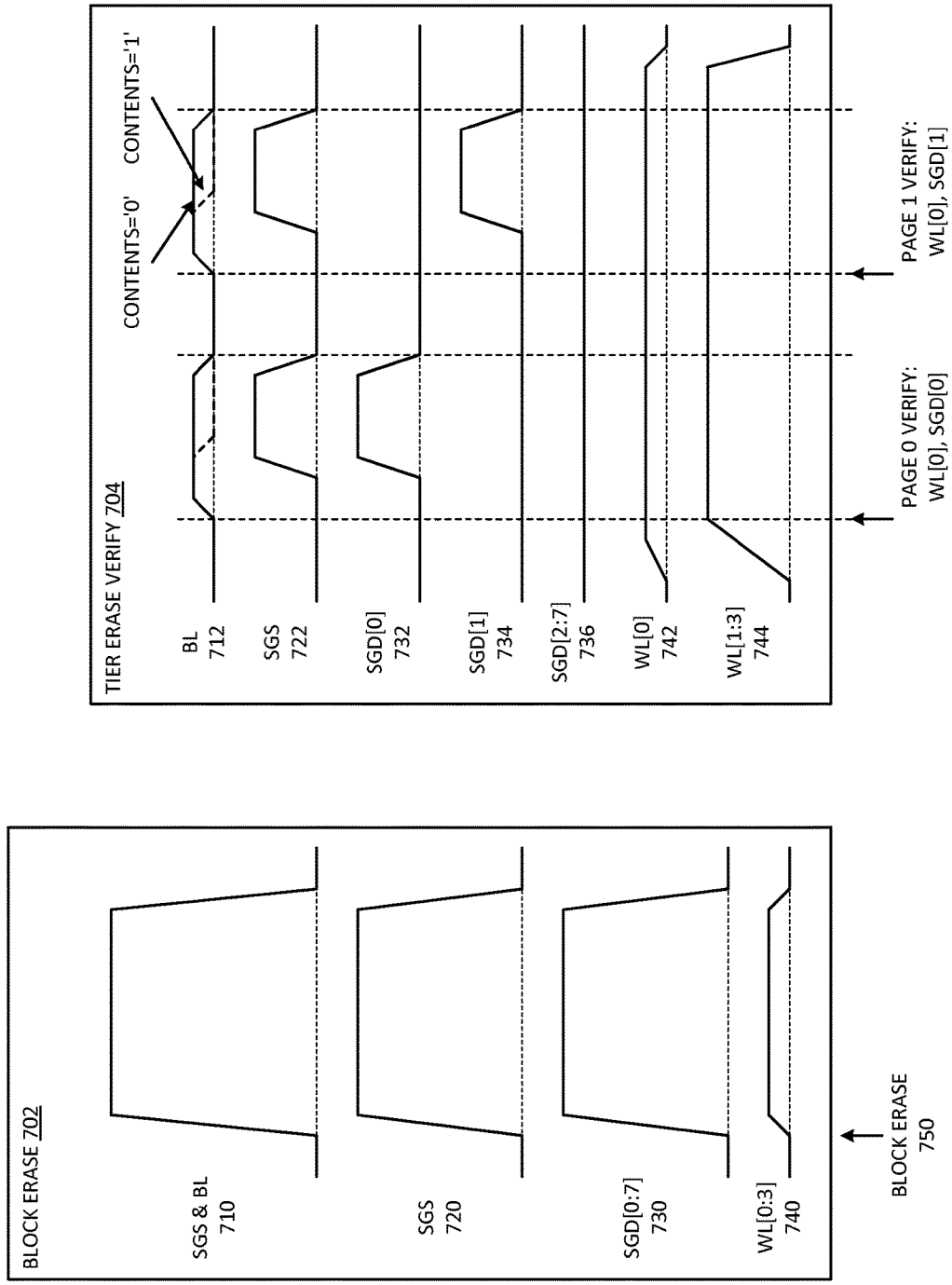
FIG. 7 is a signaling diagram of an embodiment of an erase followed by a tier erase verify for a 3D memory.

FIG. 7 is a signaling diagram of an embodiment of an erase followed by a tier erase verify for a 3D memory. In one embodiment, a memory subsystem, such as system 100 of FIG. 1, uses a tier erase verify sequence in accordance with tier erase verify mode 704 for verifying an erase. In one embodiment, block erase 702 is a sequential erase operation in accordance with what is previously known. Signal 710 illustrates the signaling diagram for the bitlines and the select gate signals, which can be raised to approximately 20 V or a voltage level for erasing or resetting a portion of memory. Signal 720 represents the signaling diagram for the select gate. Signal 730 represents the signaling for the sub-block selectors. In one embodiment, the memory charges signals 720 and 730 to approximately 15 V to erase the selected portion(s) of memory. In one embodiment, the memory can charge the wordlines to approximately 1 V for the erase, as illustrated by signal WL[0:3] 740. Each of the signals can be selected in response to block erase command 750.

In tier erase verify 704, the memory can verify the programming made in block erase 702. BL 712 illustrates the signal of read bits, where the higher line represents the bitline signal if the contents of the memory cell are '0', and the dashed line represents the bitline signal if the contents of the memory cell are '1'. In one embodiment, signal SGS 722 is selected for each sub-block as it is selected for read to verify the erase. In one embodiment, signals 722, 732, 734, and 736 can toggle between approximately 0 V and 4 V when deselected and selected, respectively. Signals SGD[0] 732, SGD[1] 734, and SGD[2:7] 736 can select the desired sub-block for verifying the erase. For tier erase verify 704, in one embodiment, selected wordline WL[0] 742 can be charged or ramped to approximately 0.5 V and be maintained (e.g., by an internal controller of the memory) for all sub-blocks to be verified in the wordline. For tier program verify 704, in one embodiment, deselected wordlines WL[1:3] 744 can be charged or ramped to approximately 6 V and be maintained (e.g., by the internal controller of the memory) for all sub-blocks to be verified in the wordline.

Figure 8:
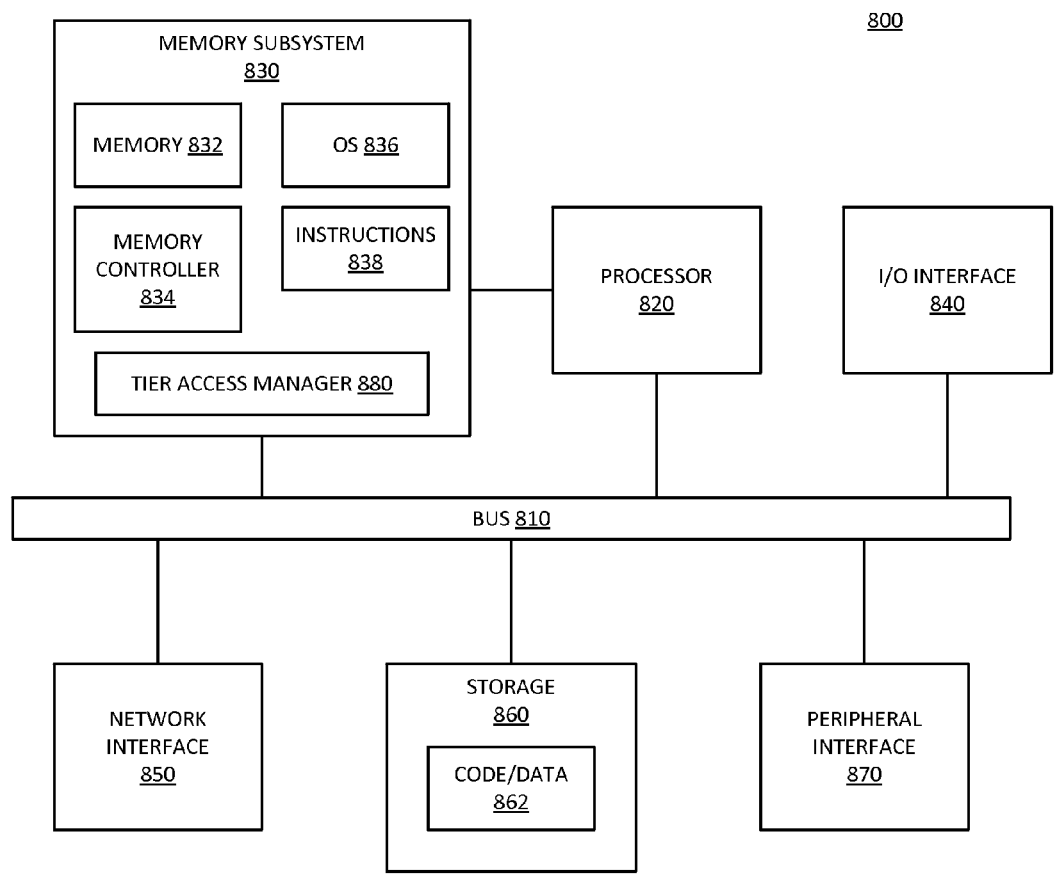
FIG. 8 is a block diagram of an embodiment of a computing system in which a 3D memory that accesses consecutive portions without discharging a wordline can be implemented.

FIG. 8 is a block diagram of an embodiment of a computing system in which a 3D memory that accesses consecutive portions without discharging a wordline can be implemented. System 800 represents a computing device in accordance with any embodiment described herein, and can be a laptop computer, a desktop computer, a server, a gaming or entertainment control system, a scanner, copier, printer, routing or switching device, or other electronic device. System 800 includes processor 820, which provides processing, operation management, and execution of instructions for system 800. Processor 820 can include any type of microprocessor, central processing unit (CPU), processing core, or other processing hardware to provide processing for system 800. Processor 820 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 830 represents the main memory of system 800, and provides temporary storage for code to be executed by processor 820, or data values to be used in executing a routine. Memory subsystem 830 can include one or more memory devices such as read-only memory (ROM), flash memory, one or more varieties of random access memory (RAM), or other memory devices, or a combination of such devices. Memory subsystem 830 stores and hosts, among other things, operating system (OS) 836 to provide a software platform for execution of instructions in system 800. Additionally, other instructions 838 are stored and executed from memory subsystem 830 to provide the logic and the processing of system 800. OS 836 and instructions 838 are executed by processor 820. Memory subsystem 830 includes memory device 832 where it stores data, instructions, programs, or other items. In one embodiment, memory subsystem includes memory controller 834, which is a memory controller to generate and issue commands to memory device 832. It will be understood that memory controller 834 could be a physical part of processor 820.

Processor 820 and memory subsystem 830 are coupled to bus/bus system 810. Bus 810 is an abstraction that represents any one or more separate physical buses, communication lines/interfaces, and/or point-to-point connections, connected by appropriate bridges, adapters, and/or controllers. Therefore, bus 810 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 810 can also correspond to interfaces in network interface 850.

System 800 also includes one or more input/output (I/O) interface(s) 840, network interface 850, one or more internal mass storage device(s) 860, and peripheral interface 870 coupled to bus 810. I/O interface 840 can include one or more interface components through which a user interacts with system 800 (e.g., video, audio, and/or alphanumeric interfacing). Network interface 850 provides system 800 the ability to communicate with remote devices (e.g., servers, other computing devices) over one or more networks. Network interface 850 can include an Ethernet adapter, wireless interconnection components, USB (universal serial bus), or other wired or wireless standards-based or proprietary interfaces.

Storage 860 can be or include any conventional medium for storing large amounts of data in a nonvolatile manner, such as one or more magnetic, solid state, or optical based disks, or a combination. Storage 860 holds code or instructions and data 862 in a persistent state (i.e., the value is retained despite interruption of power to system 800). Storage 860 can be generically considered to be a "memory," although memory 830 is the executing or operating memory to provide instructions to processor 820. Whereas storage 860 is nonvolatile, memory 830 can include volatile memory (i.e., the value or state of the data is indeterminate if power is interrupted to system 800).

Peripheral interface 870 can include any hardware interface not specifically mentioned above. Peripherals refer generally to devices that connect dependently to system 800. A dependent connection is one where system 800 provides the software and/or hardware platform on which operation executes, and with which a user interacts.

In one embodiment, memory 832 includes 3D memory, and memory subsystem 830 includes tier access manager 880. Tier access manager 880 can represent logic in memory controller 834 and/or in memory 832. Tier access manager 880 enables memory controller 834 to access portions of data from memory 832 one tier at a time, with memory 832 maintaining wordline voltage levels during a sequence of access commands. In one embodiment, the access command is a read command. In one embodiment, the access command is a program command. In one embodiment, the access command is a verify command. Thus, the energy costs associated with access commands can be spread over access operations for multiple portions of memory, and the accesses to subsequent portions in the same wordline can be performed with improved timing.

Figure 9:
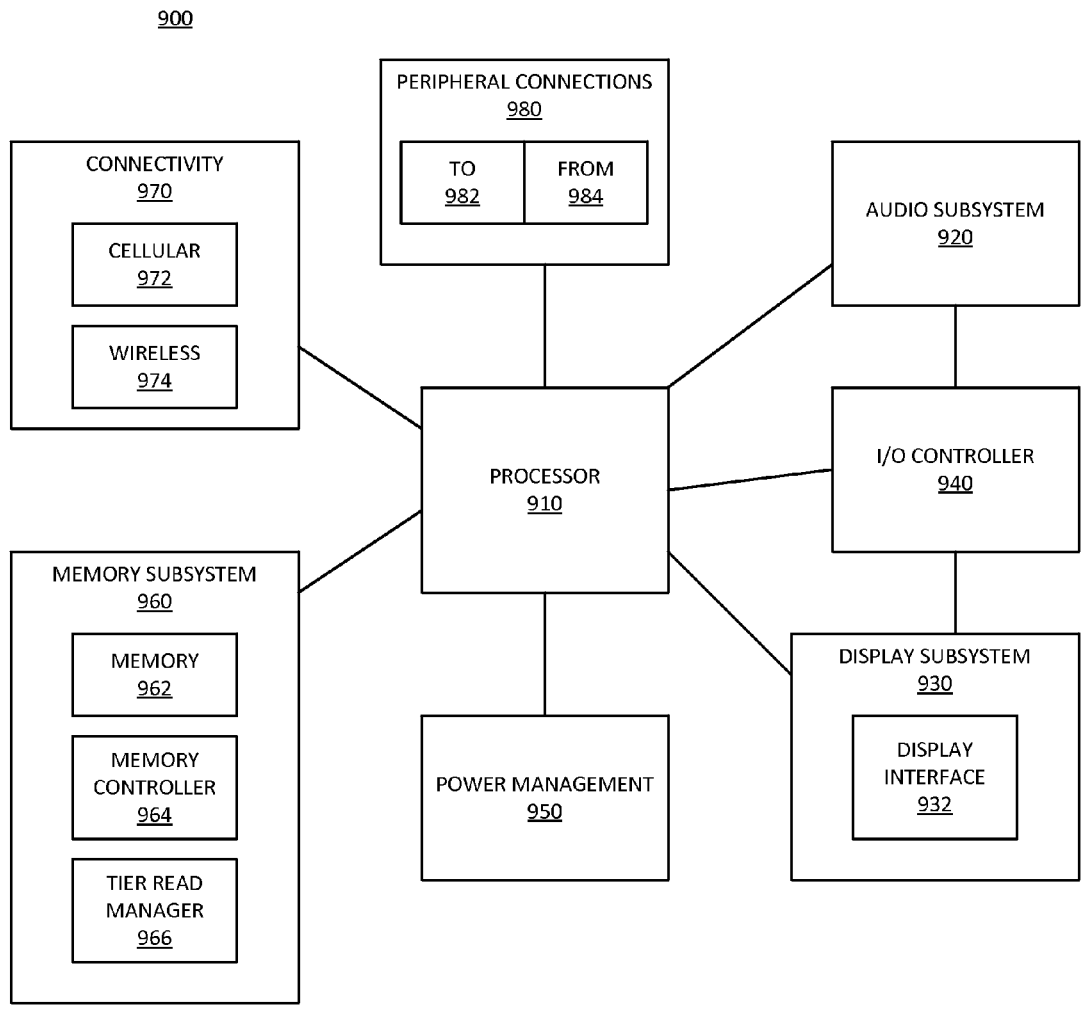
FIG. 9 is a block diagram of an embodiment of a mobile device in which a 3D memory that accesses consecutive portions without discharging a wordline can be implemented.

FIG. 9 is a block diagram of an embodiment of a mobile device in which a 3D memory that accesses consecutive portions without discharging a wordline can be implemented. Device 900 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 900.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting device 900 to another device. The processing operations can also include operations related to audio I/O and/or display I/O.

In one embodiment, device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 900, or connected to device 900. In one embodiment, a user interacts with device 900 by providing audio commands that are received and processed by processor 910.

Display subsystem 930 represents hardware (e.g., display devices) and software (e.g., drivers) components that provide a visual and/or tactile display for a user to interact with the computing device. Display subsystem 930 includes display interface 932, which includes the particular screen or hardware device used to provide a display to a user. In one embodiment, display interface 932 includes logic separate from processor 910 to perform at least some processing related to the display. In one embodiment, display subsystem 930 includes a touchscreen device that provides both output and input to a user.

I/O controller 940 represents hardware devices and software components related to interaction with a user. I/O controller 940 can operate to manage hardware that is part of audio subsystem 920 and/or display subsystem 930. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that can be included in device 900. The input can be part of direct user interaction, as well as providing environmental input to the system to influence its operations (such as filtering for noise, adjusting displays for brightness detection, applying a flash for a camera, or other features). In one embodiment, device 900 includes power management 950 that manages battery power usage, charging of the battery, and features related to power saving operation.

Memory subsystem 960 includes memory device(s) 962 for storing information in device 900. Memory subsystem 960 can include nonvolatile (state does not change if power to the memory device is interrupted) and/or volatile (state is indeterminate if power to the memory device is interrupted) memory devices. Memory 960 can store application data, user data, music, photos, documents, or other data, as well as system data (whether long-term or temporary) related to the execution of the applications and functions of system 900. In one embodiment, memory subsystem 960 includes memory controller 964 (which could also be considered part of the control of system 900, and could potentially be considered part of processor 910). Memory controller 964 includes a scheduler to generate and issue commands to memory device 962.

Connectivity 970 includes hardware devices (e.g., wireless and/or wired connectors and communication hardware) and software components (e.g., drivers, protocol stacks) to enable device 900 to communicate with external devices. The external device could be separate devices, such as other computing devices, wireless access points or base stations, as well as peripherals such as headsets, printers, or other devices.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading and/or uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory 962 includes 3D memory, and memory subsystem 960 includes tier access manager 966. Tier access manager 966 can represent logic in memory controller 964 and/or in memory 962. Tier access manager 966 enables memory controller 964 to access portions of data from memory 962 one tier at a time, with memory 962 maintaining wordline voltage levels during a sequence of access commands. In one embodiment, the access command is a read command. In one embodiment, the access command is a program command. In one embodiment, the access command is a verify command. Thus, the energy costs associated with access commands can be spread over access operations for multiple portions of memory, and the access to subsequent portions in the same wordline can be performed with improved timing.

In one aspect, a three dimensional memory device includes: multiple memory elements stacked in multiple tiers of wordlines, each addressable with a bitline address, a wordline address, and a sub-block address, where the two dimensional address including a wordline address and a bitline address, and a third dimension with a sub-block selector indicating one of multiple portions of a tier of memory elements in the memory device; and selection logic coupled to the memory elements to charge a first wordline and a first sub-block in response to receiving a first command identifying a first portion of memory elements to access with a first wordline address and a first sub-block selector, and to maintain charge to the first wordline without discharging and recharging the first wordline in response to a second command identifying a second portion of memory elements to access with the first wordline address and a second sub-block selector; and control logic to access the first portion and the second portion to execute the first and second commands.

In one embodiment, wherein the memory device comprises a three dimensional NAND memory device. In one embodiment, wherein the first portion and the second portion comprise, respectively, first and second pages of memory data. In one embodiment, wherein the first portion and the second portion comprise portions of a range of memory to access. In one embodiment, wherein the sub-block selector selects one of 16 sub-blocks. In one embodiment, wherein the first and second commands comprise read commands. In one embodiment, wherein the first and second commands comprise program commands. In one embodiment, wherein the selection logic is to maintain a select voltage to the first wordline and maintain a deselect wordline voltage to all non-selected wordlines without resetting either the first wordline or the non-selected wordlines. In one embodiment, wherein for a consecutive access operation, the selection logic is to maintain charge to the first wordline without discharging and recharging the first wordline in response to a number of access commands equal to a number of sub-blocks; discharge the first wordline after accessing a last sub-block at the first wordline; and charge a second wordline at the first sub-block in response to a subsequent consecutive access command. In one embodiment, wherein for a consecutive access operation, the selection logic is to maintain charge to the first wordline without discharging and recharging the first wordline in response to a series of access commands; discharge the first wordline after accessing a last sub-block at the first wordline; and charge a second wordline at the first sub-block in response to a subsequent consecutive access command. In one embodiment, wherein the first and second commands comprise read commands, and further comprising: sensing circuitry to read first bits at the first portion in response to the first read command, and to read second bits at the second portion in response to the second read command; and output circuitry to send data to the memory controller representing the first bits, and the second bits.

In one aspect, a memory controller for accessing data in a three dimensional memory device includes: multiple hardware connectors to couple to the memory device, including data lines to exchange data with the memory device and command/address signal lines to send commands and addresses to the memory device, wherein the memory device includes multiple memory elements, each addressable with a two dimensional address including a wordline address and a bitline address, and a third dimension with a sub-block selector indicating one of multiple portions of a tier of memory elements in the memory device; command generation logic to generate an access command, including a first command identifying a first portion of memory elements to access with a first wordline address and a first sub-block selector; and I/O (input/output) circuitry to send the first access command to the memory device via the command/address signal lines to cause the memory device to charge a first wordline and a first sub-block in response to the first access command, and to maintain charge to the first wordline without discharging and recharging the first wordline for accessing the first wordline for multiple access operations; and to receive data from the memory device.

In one embodiment, wherein the first portion comprises a first page of memory data. In one embodiment, wherein the command generation logic is to generate the first command for the first portion of memory data, and identify a range of addresses; wherein the memory device is to maintain charge to the first wordline for all portions of data in the wordline within the identified range of addresses. In one embodiment, wherein the command generation logic is to generate a read command. In one embodiment, wherein the command generation logic is to generate a program command. In one embodiment, wherein the command generation logic is to generate a command that causes the memory device to execute a series of multiple access operations in response to the one command, wherein the memory device maintains charge to the first wordline for all portions of data to access for all access operations. In one embodiment, wherein the command identifies sub-blocks of a first and a second wordline, and wherein the command causes the memory device to maintain charge to the first wordline without discharging and recharging the first wordline for all accesses to sub-blocks of the first wordline; discharge the first wordline after accessing a last sub-block at the first wordline; and charge a second wordline and maintain charge to the second wordline for all accesses to sub-blocks of the second wordline.

In one aspect, a system for reading data from a three dimensional memory device, comprising: a three-dimensional stacked memory device to store data, the memory device including multiple memory elements, each addressable with a two dimensional address including a wordline address and a bitline address, and a third dimension with a sub-block selector indicating one of multiple portions of a tier of memory elements at the wordline address; a memory controller coupled to the memory device, the memory controller including command generation logic to generate an access command, including an access command identifying a first portion of memory elements to access with a first wordline address and a first sub-block selector; decode logic at the memory device to charge the first wordline and the first sub-block in response to receiving the access command, and to maintain charge to the first wordline without discharging and recharging the first wordline to execute multiple access operations to the first sub-block and other sub-blocks of the first wordline to service the access command; and a touchscreen display coupled to generate a display based on data accessed from the memory device.

In one embodiment, wherein the memory device comprises a three dimensional NAND memory device. In one embodiment, wherein the first portion comprises a first page of memory data, wherein each wordline of the memory device stores multiple pages. In one embodiment, wherein the sub-block selector selects one of 16 sub-blocks. In one embodiment, wherein the command generation logic is to generate the access command for the first portion of memory data, and identify a range of addresses for the access command; wherein the memory device is to maintain charge to the first wordline for all portions of data in the wordline within the identified range of addresses. In one embodiment, wherein the command generation logic is to generate a read command. In one embodiment, wherein the command generation logic is to generate a program command. In one embodiment, wherein the decode logic is to maintain a select voltage to the first wordline and maintain a deselect wordline voltage to all non-selected wordlines without resetting either the first wordline or the non-selected wordlines. In one embodiment, wherein for a consecutive access operation, the decode logic is to maintain charge to the first wordline without discharging and recharging the first wordline in response to a number of access commands equal to a number of sub-blocks; discharge the first wordline after accessing a last sub-block at the first wordline; and charge a second wordline at the first sub-block in response to a subsequent consecutive access command. In one embodiment, wherein for a consecutive access operation, the decode logic is to maintain charge to the first wordline without discharging and recharging the first wordline in response to a number of access commands; discharge the first wordline after accessing a last sub-block at the first wordline; and charge a second wordline at the first sub-block in response to a subsequent consecutive access command.

In one aspect, a method for accessing a three dimensional memory device includes: receiving one or more access commands from a memory controller, where every memory element of the memory device is addressable in three dimensions with a two-dimensional address including a wordline address and a bitline address, and a third dimension with a sub-block selector indicating one of multiple portions of a tier of memory elements in the memory device, wherein the one or more access commands identify a first portion of memory elements to read with a first wordline address and a first sub-block selector; in response to the one or more access commands, generating multiple access operations to access the first wordline at the first sub-block and a second sub-block; charging the first wordline in response to execute the operations; accessing the first wordline at the first sub-block; maintaining the first wordline charged without discharging the first wordline; and accessing the first wordline at the second sub-block.

In one embodiment, wherein generating the multiple access operations comprises generating the multiple access operations in response to a request to access a section of data including multiple portions, wherein each access operation accesses a single portion. In one embodiment, wherein generating the multiple access operations comprises generating one or more read operations, program operations, or verify operations, or a combination.

In one aspect, an apparatus for accessing a three dimensional memory device includes: means for receiving one or more access commands from a memory controller, where every memory element of the memory device is addressable in three dimensions with a two-dimensional address including a wordline address and a bitline address, and a third dimension with a sub-block selector indicating one of multiple portions of a tier of memory elements in the memory device, wherein the one or more access commands identify a first portion of memory elements to read with a first wordline address and a first sub-block selector; means for generating, in response to the one or more access commands, multiple access operations to access the first wordline at the first sub-block and a second sub-block; means for charging the first wordline in response to execute the operations; means for accessing the first wordline at the first sub-block; means for maintaining the first wordline charged without discharging the first wordline; and means for accessing the first wordline at the second sub-block.

In one embodiment, wherein the means for generating the multiple access operations comprises means for generating the multiple access operations in response to a request to access a section of data including multiple portions, wherein each access operation accesses a single portion. In one embodiment, wherein the means for generating the multiple access operations comprises means for generating one or more read operations, program operations, or verify operations, or a combination.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible. A component can be configured to perform an operation or interact with another component. A component can be configured through hardware means or through software means or a combination. A component can be configured through physical connections provided via a circuit or interconnect device.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:
1. A three dimensional (3D) memory device, comprising:
   multiple memory elements stacked in multiple tiers of wordlines, the memory elements addressable with a bitline address, a wordline address, and a sub-block address; and
   logic to:
      receive a first command and a second command to access different portions of a first wordline from a memory controller;
      in response to receipt of the first command, charge a first wordline, a first bitline, and a first sub-block to select a first portion of the first wordline, and discharge the first bitline and the first sub-block, but not the first wordline, after the access to the first portion;
      in response to receipt of the second command after the first command, to maintain charge to the first wordline without the first wordline being discharged and recharged, and charge a second bitline and a second sub-block to select a second portion of the wordline, and after the access to the second portion, discharge the second bitline and the second sub-block, but not the first wordline;
      receive a third command to access a second wordline from the memory controller, the memory controller to send the third command only after a determination that a last sub-block of the first wordline has been accessed; and
      in response to receipt of a third command, discharge the first wordline, charge the second wordline, a third bitline, and a third sub-block to select a portion of the second wordline.

2. The memory device of claim 1, wherein the memory device comprises a three dimensional NAND memory device.

3. The memory device of claim 1, wherein:
   the first portion and the second portion comprise different pages of memory data; and
   wherein the logic is to maintain the charge to the first wordline to access both the different pages of memory data without the first wordline being discharged and recharged between accesses to the different pages.

4. The memory device of claim 1, wherein the sub-block address is to select one of 16 sub-blocks.

5. The memory device of claim 1, wherein the first and second commands comprise read commands, or program commands.

6. The memory device of claim 1, wherein the logic is to maintain a select voltage to the first wordline and maintain a deselect wordline voltage to all non-selected wordlines without reset of either the first wordline or the non-selected wordlines.

7. The memory device of claim 1, wherein the first and second commands comprise read commands, and further comprising:
   sensing circuitry to read first bits at the first portion in response to the first read command, and to read second bits at the second portion in response to the second read command; and
   output circuitry to send data to the memory controller representing the first bits, and the second bits.

8. A memory controller for accessing data in a three dimensional (3D) memory device, comprising:
   logic to:
      receive a request to read or write data to the 3D memory device;
      identify a first portion of the data with a first wordline address, a first bitline address, and a first sub-block selector;
      generate a first command to access the first portion of the data;
      identify a second portion of the data with the first wordline address and a second sub-block selector;
      generate a second command to access the second portion of the data;
      determine whether a last sub-block of the first wordline has been accessed;
      in response to a determination that the last sub-block of the first wordline has been accessed, identify a third portion of the data with a second wordline address;
      generate a third command to access the third portion of the data; and
   I/O (input/output) circuitry to:
      send the first command to the memory device to cause the memory device to charge a first wordline, a first bitline, and a first sub-block, and after the access to the first portion of the data, discharge the first bitline and the first sub-block, but not the first wordline;
      send the second command to the memory device to cause the memory device to maintain charge to the first wordline; and send the third command to the memory device only after the determination that the last sub-block of the first wordline has been accessed, the third command to cause the memory device to discharge the first wordline and charge a second wordline.

9. The memory controller of claim 8, wherein the first portion of the data comprises a first page of memory data.

10. The memory controller of claim 8, wherein: the logic is to identify a range of addresses; and wherein the memory device is to maintain charge to the first wordline for all portions of data in the first wordline within the identified range of addresses.

11. The memory controller of claim 8, wherein the logic is to generate a read command, or a program command.

12. A system comprising:
 a three dimensional (3D) memory device including multiple memory elements, the memory elements addressable with a bitline address, a wordline address, and a sub-block selector;
   a memory controller coupled to the memory device, the memory controller including:logic to:
     receive a request to read or write data to the 3D memory device;
     identify a first portion of the data with a first wordline address, a first bitline address, and a first sub-block selector;
     generate a first command to access the first portion of the data;
     identify a second portion of the data with the first wordline address and a second sub-block selector;
     generate a second command to access the second portion of the data;
     determine whether a last sub-block of the first wordline has been accessed;
     in response to a determination that the last sub-block of the first wordline has been accessed, identify a third portion of the data with a second wordline address;
     generate a third command to access the third portion of the data; and
   I/O (input/output) circuitry to:
     send the first command to the memory device to cause the memory device to charge a first wordline, a first bitline, and a first sub-block, and after the access to the first portion of the data, discharge the first bitline and the first sub-block, but not the first wordline;
     send the second command to the memory device to cause the memory device to maintain charge to the first wordline; and
   send the third command to the memory device only after the determination that the last sub-block of the first wordline has been accessed, the third command to cause the memory device to discharge the first wordline and charge a second wordline; and
 a touchscreen display coupled to generate a display based on data accessed from the memory device.

13. The system of claim 12, wherein: the first portion comprises a first page of memory data, wherein each wordline of the memory device stores multiple pages.

14. The system of claim 12, wherein the logic is to identify a range of addresses for the first command; and wherein the memory device is to maintain charge to the first wordline for all portions of data in the first wordline within the identified range of addresses.

15. The system of claim 12, wherein the logic is to generate a read command, or a program command.

16. A method for accessing a three dimensional (3D) memory device, comprising:
 receiving one or more access commands from a memory controller, wherein memory elements of the memory device are addressable with a bitline address, a wordline address, and a sub-block selector, wherein the one or more access commands identify a first portion of memory elements to read with a first wordline address, a first bitline address, and a first sub-block selector;
 in response to the one or more access commands, generating multiple access operations to access a first wordline at a first sub-block and a second sub-block;
 charging the first wordline, a first bitline, and the first sub-block to execute the operations;
 accessing the first wordline at the first sub-block;
 discharging the first bitline and the first sub-block, but not the first wordline;
 maintaining the first wordline charged without discharging the first wordline, and charging a second bitline and second sub-block;
 accessing the first wordline at the second sub-block;
 receiving one or more second access commands from the memory controller, wherein the one or more second access commands identify a second portion of memory elements to read with a second wordline address;
 in response to the one or more second access commands, generating multiple second access operations to access the second wordline; and
 in response to receipt of the one or more second access commands, discharging the first wordline and charging a second wordline.

17. The method of claim 16, wherein generating the multiple access operations comprises generating the multiple access operations in response to a request to access a section of data including multiple portions, wherein each access operation accesses a single portion.

18. The method of claim 16, wherein generating the multiple access operations comprises generating one or more read operations, program operations, or verify operations, or a combination.

19. The memory controller of claim 8, wherein the first portion of the data and the second portion of the data are not adjacent sub-blocks.

20. The memory controller of claim 8, wherein the logic is to further:
 program a mode register to cause the memory device to be in a first mode or a second mode, wherein the memory device is to discharge a wordline after each access in the first mode, and wherein the memory device is to maintain charge to a given wordline for multiple accesses to the given wordline in the second mode.

* * * * *